US009191246B2

(12) United States Patent
Kanter

(10) Patent No.: US 9,191,246 B2
(45) Date of Patent: Nov. 17, 2015

(54) COMBINED TURBO DECODING AND TURBO EQUALIZATION TECHNIQUES

(71) Applicant: Jonathan Kanter, Olympic Valley, CA (US)

(72) Inventor: Jonathan Kanter, Olympic Valley, CA (US)

(*) Notice: Subject to any disclaimer, the term of this patent is extended or adjusted under 35 U.S.C. 154(b) by 0 days.

(21) Appl. No.: 14/199,964

(22) Filed: Mar. 6, 2014

(65) Prior Publication Data

US 2014/0269891 A1  Sep. 18, 2014

Related U.S. Application Data

(60) Provisional application No. 61/802,038, filed on Mar. 15, 2013.

(51) Int. Cl.

| | |
|---|---|
| *H03H 7/30* | (2006.01) |
| *H03H 7/40* | (2006.01) |
| *H03K 5/159* | (2006.01) |
| *H04L 25/03* | (2006.01) |
| *H04L 27/01* | (2006.01) |
| *H03M 13/25* | (2006.01) |
| *H03M 13/27* | (2006.01) |
| *H04B 1/12* | (2006.01) |
| *H04L 27/26* | (2006.01) |
| *H03M 13/11* | (2006.01) |
| *H03M 13/23* | (2006.01) |

(52) U.S. Cl.
CPC ....... *H04L 25/03159* (2013.01); *H03M 13/258* (2013.01); *H03M 13/2732* (2013.01); *H04B 1/12* (2013.01); *H04L 27/01* (2013.01); *H03M 13/11* (2013.01); *H03M 13/23* (2013.01); *H04L 27/2647* (2013.01); *H04L 27/2649* (2013.01)

(58) Field of Classification Search
CPC .................. H04L 25/03057; H04L 2025/0349
USPC ........................................................ 375/233
See application file for complete search history.

(56) References Cited

U.S. PATENT DOCUMENTS

| | | | |
|---|---|---|---|
| 4,633,470 | A | 12/1986 | Welch et al. |
| 4,945,549 | A | 7/1990 | Simon et al. |
| 5,258,987 | A | 11/1993 | Wei |
| 5,446,747 | A | 8/1995 | Berrou |
| 6,307,901 | B1 | 10/2001 | Yu et al. |

(Continued)

FOREIGN PATENT DOCUMENTS

| | | |
|---|---|---|
| EP | 1233565 A2 | 8/2002 |
| EP | 2566054 A1 * | 3/2013 |

(Continued)

OTHER PUBLICATIONS

"Asymmetric Digital Subscriber Line (ADSL) transceivers—Extended bandwidth ADSL2 (ADSL2+)," Series G: Transmission Systems and Media, Digital Systems and Networks, International Telecommuncation Union, G.992.5, Jan. 2005 (110 pages).

(Continued)

*Primary Examiner* — Tanmay Shah
(74) *Attorney, Agent, or Firm* — Perkins Coie LLP

(57) ABSTRACT

Techniques are disclosed for turbo decoding orthogonal frequency division multiplexing OFDM symbols. Techniques for combined turbo decoding and equalization are disclosed. The disclosed techniques can be implemented in receivers that receive wired or wireless OFDM signals and produce data and control bits by decoding the received signals.

24 Claims, 13 Drawing Sheets

(56) References Cited

U.S. PATENT DOCUMENTS

| | | |
|---|---|---|
| 6,757,859 B1 | 6/2004 | Jin |
| 6,795,507 B1 | 9/2004 | Xin et al. |
| 7,212,569 B1 | 5/2007 | Clark |
| 7,243,294 B1 | 7/2007 | Divsalar et al. |
| 7,340,000 B1 | 3/2008 | Hart et al. |
| 7,974,372 B2 | 7/2011 | Yoshida |
| 8,879,647 B2 | 11/2014 | Ashikhmin et al. |
| 2001/0025358 A1* | 9/2001 | Eidson et al. ............... 714/752 |
| 2001/0054170 A1 | 12/2001 | Chass et al. |
| 2004/0247038 A1* | 12/2004 | Uesugi et al. ............... 375/260 |
| 2004/0255229 A1 | 12/2004 | Shen et al. |
| 2006/0023802 A1 | 2/2006 | Balakrishnan et al. |
| 2007/0147535 A1 | 6/2007 | Niu et al. |
| 2007/0217536 A1 | 9/2007 | Choi |
| 2008/0232499 A1 | 9/2008 | Guerrieri et al. |
| 2008/0273614 A1 | 11/2008 | Heegard et al. |
| 2009/0046796 A1* | 2/2009 | Park et al. ............... 375/265 |
| 2009/0135934 A1 | 5/2009 | Guerrieri et al. |
| 2011/0051831 A1 | 3/2011 | Subrahmanya et al. |
| 2011/0110273 A1 | 5/2011 | Copeland |
| 2011/0194475 A1 | 8/2011 | Kim et al. |
| 2012/0106619 A1* | 5/2012 | Kawauchi et al. ............... 375/233 |
| 2012/0134446 A1 | 5/2012 | Zhou et al. |
| 2012/0272118 A1 | 10/2012 | Shen et al. |
| 2012/0326898 A1 | 12/2012 | Bossert et al. |
| 2013/0202060 A1* | 8/2013 | Nishikawa ............... 375/300 |
| 2014/0270009 A1 | 9/2014 | Kanter |
| 2014/0344648 A1 | 11/2014 | Kanter |

FOREIGN PATENT DOCUMENTS

| | | |
|---|---|---|
| WO | 2012158083 A1 | 11/2012 |
| WO | 2014150061 A1 | 9/2014 |
| WO | 2014150070 A2 | 9/2014 |

OTHER PUBLICATIONS

"Asymmetric digital subscriber line transceivers 2 (ADSL2)," Series G: Transmission Systems and Media, Digital Systems and Networks, International Telecommuncation Union, G.992.3, Apr. 2009 (404 pages).

"LTE; Evolved Universal Terrestrial Radio Access (E-UTRA), Multiplexing and channel coding (3GPP TS 36.212 version 8.4.0 Release 8)," European Telecommunications Standards Institute, Nov. 2008 (58 pages).

"Very high speed digital subscriber line transceivers 2 (VDSL2)," Series G: Transmission Systems and Media, Digital Systems and Networks, International Telecommuncation Union, G.993.2, Dec. 2011 (376 pages).

Austin, M.E., "Decision-Feedback Equalization For Digital Communication Over Dispersive Channels," Massachusetts Institute of Technology, Research Laboratory of Electronics, Technical Report 437, Aug. 11, 1967 (102 pages).

Benedetto, S., et al. "Serial Concatenation of Interleaved Codes: Performance Analysis, Design, and Iterative Decoding," IEEE Transactions on Information Theory, vol. 44, Issue 3, May 1998 (18 pages).

Douillard, C., et al. "Iterative Correction of Intersymbol Interference: Turbo-Equalization," ENST de Bretagne, vol. 6, Issue 5, Sep.-Oct. 1995 (5 pages).

Forney, G., "Burst-Correcting Codes for the Classic Bursty Channel," IEEE Transactions on Communications Technology, vol. COM-19, Issue 5, Oct. 1971 (10 pages).

Forney, G., "The Viterbi Algorithm," Proceedings of the IEEE, vol. 61, Issue 3, Mar. 1973 (11 pages).

Glavieux, A., et al. "Turbo Equalization Over A Frequency Selective Channel," International Symposium on Turbo Codes, 1997 (7 pages).

Hall, E., "Stream-Oriented Turbo Codes," IEEE Transactions on Information Theory, vol. 47, Issue 5, Jul. 2001 (19 pages).

International Search Report and Written Opinion dated Jul. 1, 2014 for International Application No. PCT/US2014/022061, filed Mar. 7, 2014 (8 pages).

International Search Report and Written Opinion dated Sep. 12, 2014 for International Application No. PCT/US2014/022089, filed Mar. 7, 2014 (12 pages).

Laot, C., et al. "Turbo Equalization: Adaptive Equalization and Channel Decoding Jointly Optimized," IEEE Journal on Selected Areas in Communications, vol. 19, Issue 9, Sep. 2001 (9 pages).

Massey, J., "Shift-Register Synthesis and BCH Decoding," IEEE Transactions on Information Theory, vol. IT-15, Issue 1, Jan. 1969 (6 pages).

Ramsey, J., "Realization of Optimum Interleavers," IEEE Transactions on Information Theory, vol. IT-16, Issue 3, May 1970 (8 pages).

Raphaeli, D., et al. "Combined Turbo Equalization and Turbo Decoding" IEEE Communications Letters, vol. 2, Issue 4, Apr. 1998 (5 pages).

Reed, I.S., et al. "Polynomial Codes Over Certain Finite Fields," J. Sac. Ind. Appl. Math., vol. 8, pp. 300-304, Jun. 1960, (2 pages).

Tuchler, M., et al. "Turbo Equalization: Principles and New Results," IEEE Transactions on Communications, vol. 50, Issue 5, May 2002 (14 pages).

Ungerboeck, G., "Channel Coding with Multilevel/Phase Signals," IEEE Transactions on Information Theory, vol. IT-28, Issue 1, Jan. 1982 (13 pages).

Viterbi, A., "Error Bounds for Convolutional Codes and an Asymptotically Optimum Decoding Algorithm," IEEE Transactions on Information Theory, vol. IT-13, Issue 2, Apr. 1967 (10 pages).

Wei, L., "Trellis-Coded Modulation with Multidimensional Constellations," IEEE Transactions on Information Theory, vol. IT-33, Issue 4, Jul. 1987 (19 pages).

Yoshida, M., et al. "An LDPC-Coded OFDM Receiver with pre-FFT Iterative Equalizer for ISI Channels," IEEE, 2005 (4 pages).

* cited by examiner

Fig. 1. Structure of rate 1/3 Turbo encoder in LTE.

COMBINED TURBO DECODING AND TURBO EQUALIZATION TECHNIQUES

CROSS-REFERENCE TO RELATED APPLICATION(S)

This patent application claims the benefit of U.S. Provisional Patent Application No. 61/802,038, filed on Mar. 15, 2013. The entire content of the before-mentioned provisional patent application is incorporated by reference herein.

TECHNICAL FIELD

This document relates to digital communication.

BACKGROUND

Many modern digital communication systems use orthogonal frequency division multiplexing (OFDM) modulation technology. Various types of error correction codes are used to increase robustness of transmitted signals. For example, OFDM and error coding is used in wireless technologies such as Long Term Evolution (LTE) and wired communication technologies such as digital subscriber line (DSL).

SUMMARY

This document describes technologies, among other things, for turbo decoding of OFDM modulation signals. In some implementations, a combined turbo decoding and turbo equalization technique may be used.

In one aspect, methods, systems and apparatus for combined turbo decoding and turbo equalization include buffering of one or more OFDM symbols which is greater than or equal to the interleaving between the component codes of a concatenated code. Where the error correcting code is a parallel or serial concatenated code (i.e., consists of two or more component codes, and one or more interleavers,) or LDPC (low density parity check) code. The interleaving may extend over more than one OFDM symbol.

In some implementations buffering of OFDM symbols, and ISI subtraction in the frequency domain is performed.

In another aspect, methods, systems and apparatus Hard or soft re-encoded data to the decision feedback equalizer from three classes of data: 1. Demapped data, 2. A re-encoded synchronization symbol. Or an inner or first component decoder. 3. Re-encoded data from an outer or second component decoder, or either component decoder on second or later decoding iterations. The third class of data may only available after the interleaver or deinterleaver delay, and so is not available for the first iteration of decision feedback equalization.

In another aspect, the disclosed data reception techniques use a constellation demapper and mapper that supports variable size constellations.

In another aspect, a transmitted symbol replica includes replication of PAR reduction.

In another aspect, IFFT and FFT fast convolution for replica of the channel and receiver prefiltering may be performed.

In another aspect, summing of the received signal replica and echo replica (for any echo cancellation) in the frequency domain may be performed.

These and other aspects, and their implementations and variations are set forth in the drawings, the description and the claims.

BRIEF DESCRIPTION OF THE DRAWINGS

Like reference symbols in the various drawings indicate like elements.

DETAILED DESCRIPTION

Figure 1:
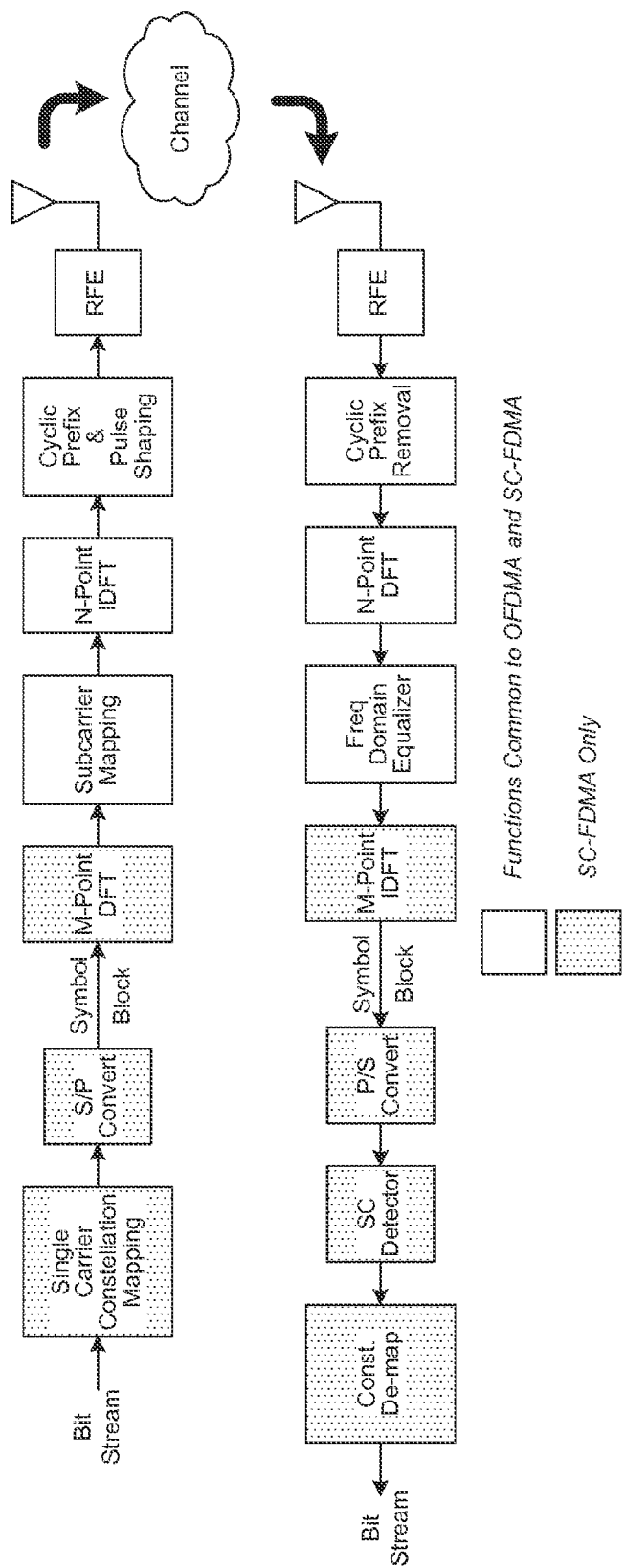
FIG. 1 is a block diagram of turbo coding and modulation as used in a Long Term Evolution (LTE) system.

Techniques for turbo decoding and turbo equalization of received signals to produce data bits are disclosed. In the description, the Wowing abbreviations are used.

3GPP LTE=Third Generation Partnership Project, Long Term Evolution
ADSL=Asymmetric Digital Subscriber Line
AFE=Analog Front End
ASIC=Application Specific Integrated Circuit
BPSK=Binary Phase Shift Keying
DFE=Decision Feedback Equalizer
DSL=Digital Subscriber Line
EPROM=Erasable Programmable Read Only Memory
EEPROM=Electrically Erasable Programmable Read Only Memory
FEQ=Frequency Domain Equalizer
FFT=Fast Fourier Transform
FPGA=Field Programmable Gate Array
IEEE=Institute of Electrical and Electronics Engineers
IFFT=Inverse Fast Fourier Transform
ISI=Inter Symbol Interference
ITU=International Telecommunications Union
LAN=Local Area Network
LDPC=Low Density Parity Check
LLR=Log Likelihood Ratio
LSBs=Least Significant Bits
LTE=Long Term Evolution
MAP=Maximum a Posteriori
MSBs=Most Significant Bits
n-QAM=Quadrature Amplitude Modulation
n-QPSK=Quadrature Phase Shift Keying
OFDM=Orthogonal Frequency Division Multiplexing PAR=Peak to Average Ratio
SISO=Soft Input Soft Output
SOVA=Soft output Viterbi Algorithm
TCM=Trellis Coded Modulation
VDSL=Very High Speed Digital Subscriber Line Orthogonal frequency division multiplexing (OFDM) is a multicarrier modulation and demodulation technique, that uses an inverse fast Fourier transform (IFFT) for modulation and a fast Fourier transform (FFT) for demodulation. The frequency bins of the transforms act as carriers, and may use signal constellations of one or more bits (i.e. from BPSK to n-QPSK). A cyclic extension may be added to the output of the IFFT for transmission, and removed on reception before the input to FFT. An OFDM symbol consists of the output of the transmit IFFT, with any cyclic extension, and after any windowing or peak to average ratio (PAR) reduction. The cyclic extension acts as a guard interval, so that intersymbol interference (ISI) that is within the guard interval doesn't affect the demodulated signal. ISI is typically constrained to fit within the guard interval by a linear equalizer, or extending the guard interval, or a combination of the two. Both discard some of the received energy before demodulation, and so reduce the possible data rate. And the ISI may still extend beyond the guard interval, reducing the signal to interference ratio of the demodulated signal, and the data rate.

For both single and multicarrier modulation, linear equalization is the simplest type of equalization. Decision feedback equalization (i.e. ISI cancellation) provides better performance. Turbo decision feedback equalization, where the equalization is iterated, using hard or soft decisions from an error correcting code, gives even better performance. And combined turbo equalization and turbo decoding, where the equalization is iterated, in conjunction with the decoding of a concatenated error correcting code that is also iterated, gives even better performance.

Iteratively decoded error correcting codes provide the greatest coding gain, and can be combined with OFDM. Iteratively decoded error correcting codes include: parallel concatenated convolutional codes, serially concatenated convolutional codes, serially concatenated trellis coded modulation and block codes, and low density parity check (LDPC) codes.

In some embodiments, the performance of OFDM receivers is improved by combined turbo equalization and turbo decoding.

The International Telecommunications Union (ITU) Asymmetric Digital Subscriber Line (ADSL) and Very High Speed Digital Subscriber Line (VDSL) standards, 3GPP LTE standard, IEEE 802.11a/g/ac wireless LAN standards, and others, specify OFDM as the modulation scheme for signal carriage.

The ADSL and VDSL standards specify an error correcting code consisting of serially concatenated trellis coded modulation (TCM) and Reed Solomon block codes, with convolutional interleaving. The 3GPP LTE standard specifies a parallel concatenated convolutional code, with turbo decoding. The 802.11n/ac standards include LDPC codes as an optional feature.

Figure 2:
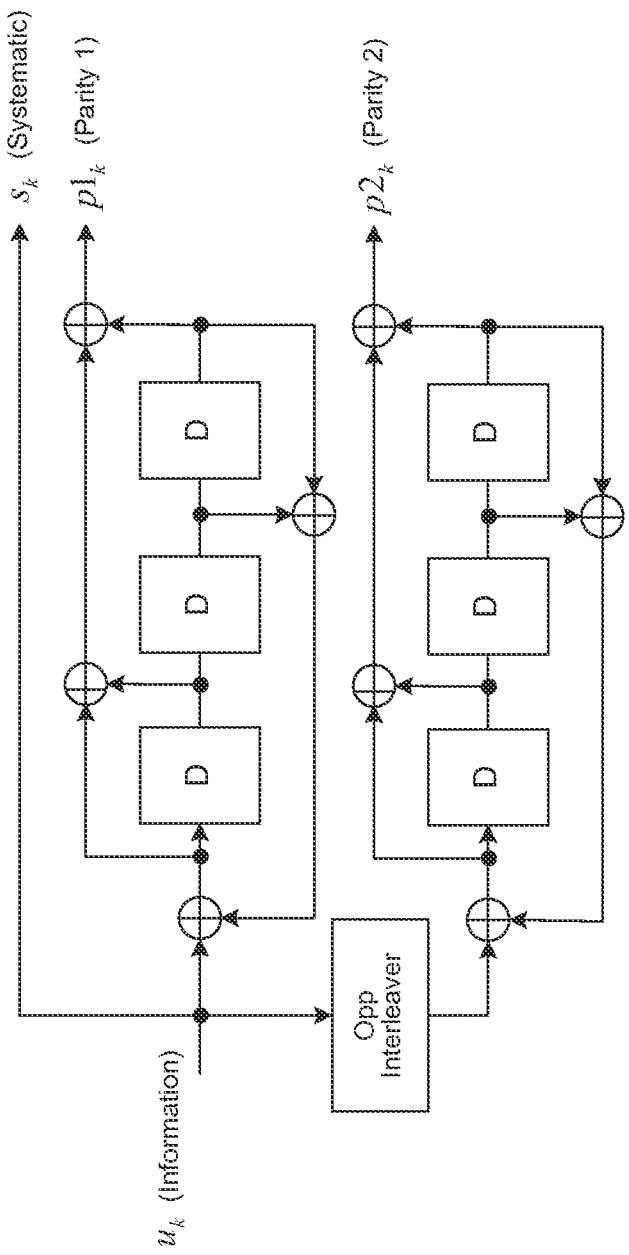
FIG. 2 is a block diagram of an LTE turbo encoder.
Figure 3:
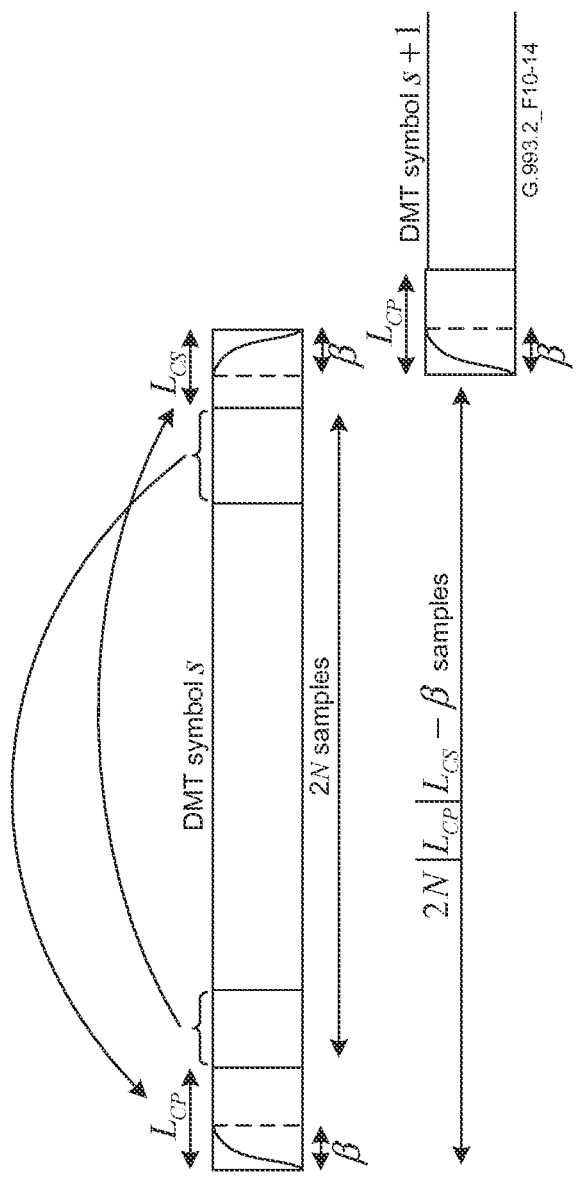
FIG. 3 illustrates cyclic extension with windowing.

LTE cell phones use OFDM, and Parallel Concatenated Convolutional Codes with turbo decoding for error correction. Equalization has been treated independently. The LTE standard provides for two different lengths of cyclic prefix, so that linear equalization can be used. FIG. 1 is a block diagram of turbo coding and modulation as used in a Long Term Evolution (LTE) system. FIG. 2 is a block diagram of an LTE turbo encoder. FIG. 3 illustrates cyclic extension with windowing.

ADSL and VDSL use OFDM for modulation and serially concatenated trellis coded modulation and Reed Solomon block codes for error correction. Single iteration decoding has been used in some implementations. Linear equalization has been used as receiver-side processing.

Examples of Features

Figure 4:
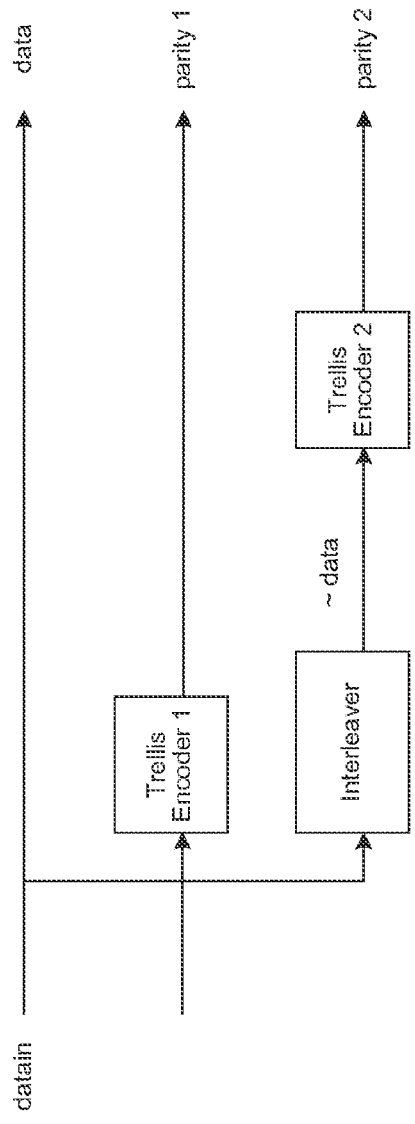
FIG. 4 illustrates an encoder for parallel concatenated convolutional codes.
Figure 5:
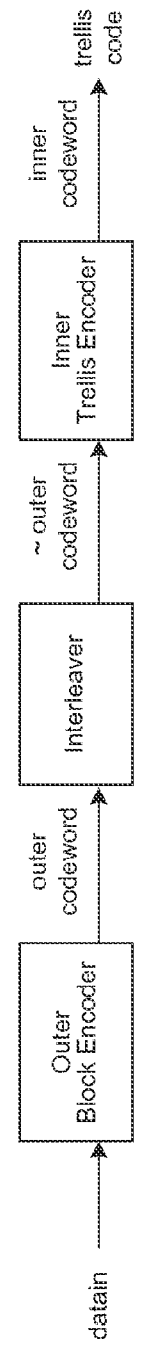
FIG. 5 illustrates an encoder for serially concatenated trellis coded modulation (TCM) and block codes.

In some embodiments, buffering of one or more OFDM symbols, which is greater than or equal to the interleaving between the component codes of a concatenated code, may be used. This may be used where the error correcting code is a parallel or serial concatenated code (i.e., consists of two or more component codes, and one or more interleavers,) or LDPC code. The interleaving may extend over more than one OFDM symbol. FIG. 4 illustrates an encoder for parallel concatenated convolutional codes. FIG. 5 illustrates an encoder for serially concatenated trellis coded modulation (TCM) and block codes.

In some embodiments, as described in this document, buffering of OFDM symbols, and ISI subtraction may be performed in the frequency domain.

In some embodiments, hard or soft re-encoded data to the decision feedback equalizer may be provided from three classes of data: 1. Demapped data 2. A synchronization symbol—or an inner or first component decoder. 3. An outer or second component decoder—or either component decoder on second or later decoding iterations. The second class of data is only available after the interleaver or deinterleaver delay, and so is not available for the first iteration of decision feedback equalization.

Figure 6:
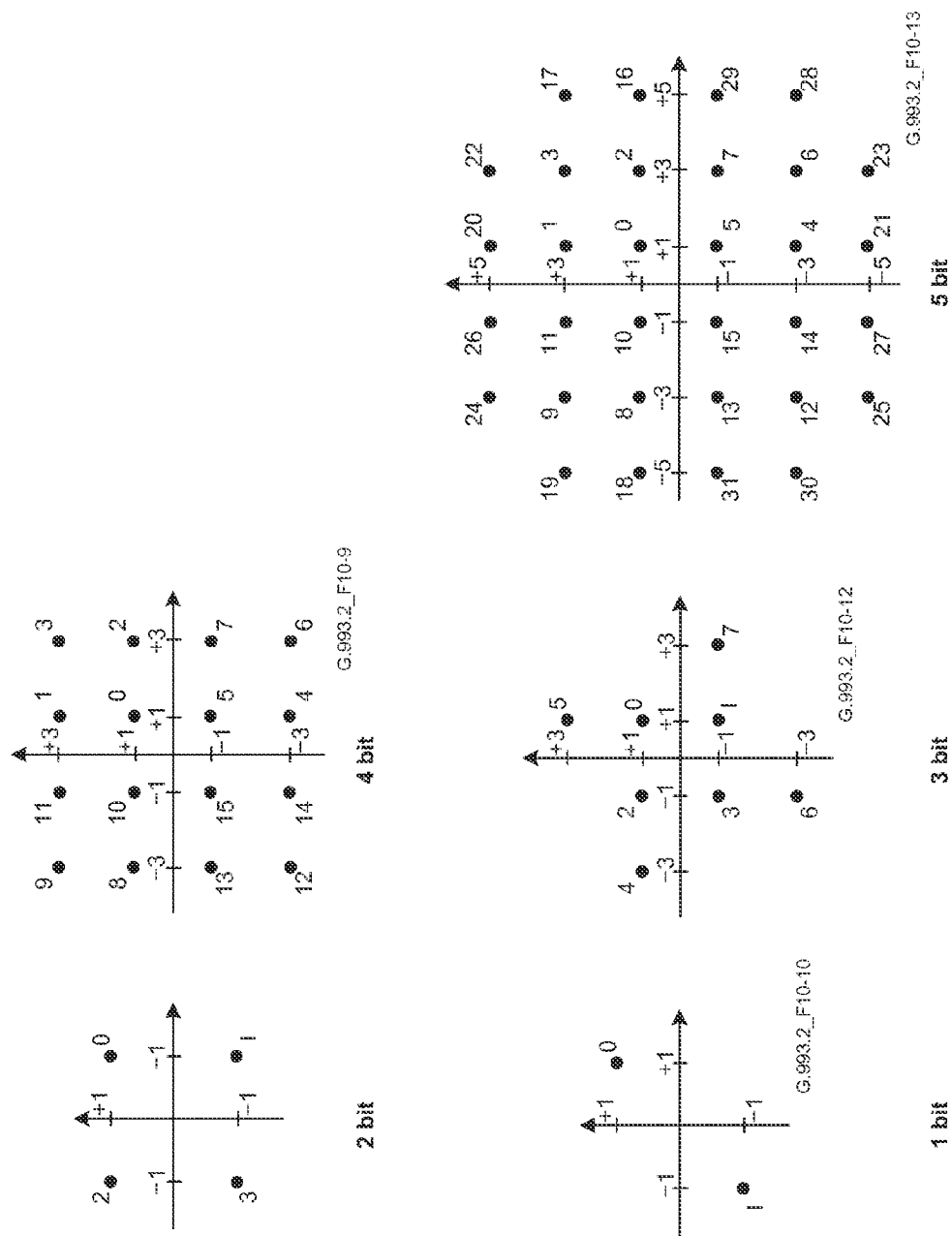
FIG. 6 depicts various constellations used in digital communications.
Figure 7:
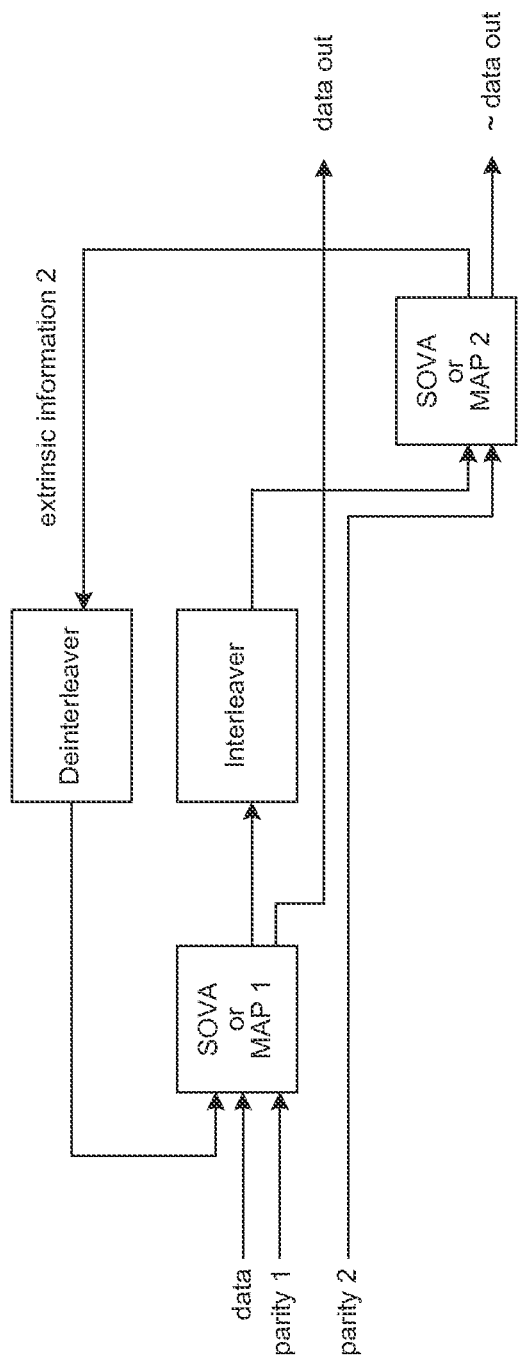
FIG. 7 illustrates a turbo decoder for parallel concatenated convolutional codes.
Figure 8:
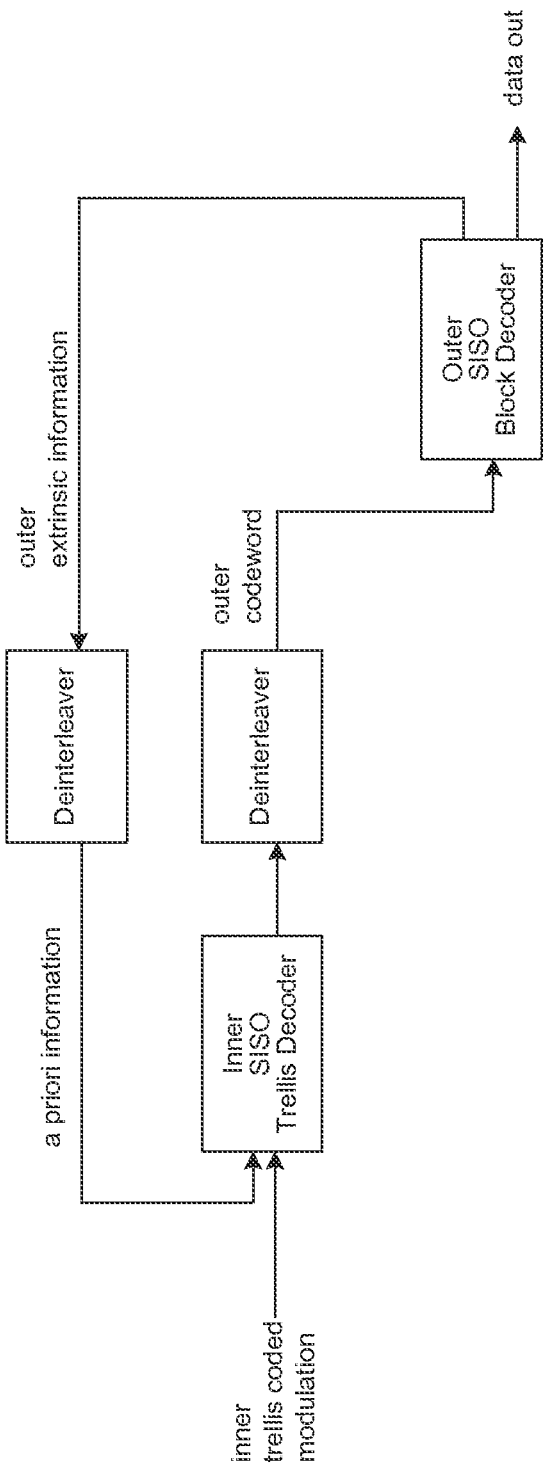
FIG. 8 illustrates a turbo decoder for serially concatenated TCM and block codes.
Figure 9:
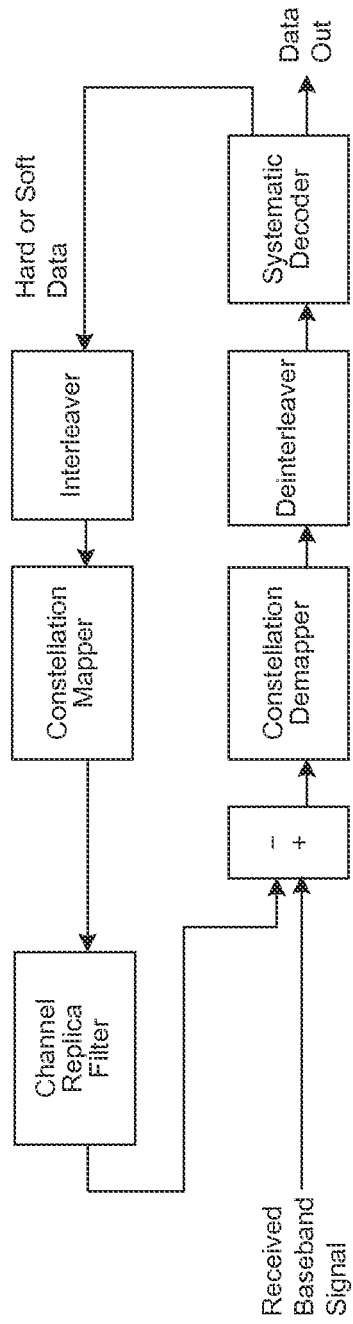
FIG. 9 illustrates a single carrier n-QAM decision feedback turbo equalizer.
Figure 10:
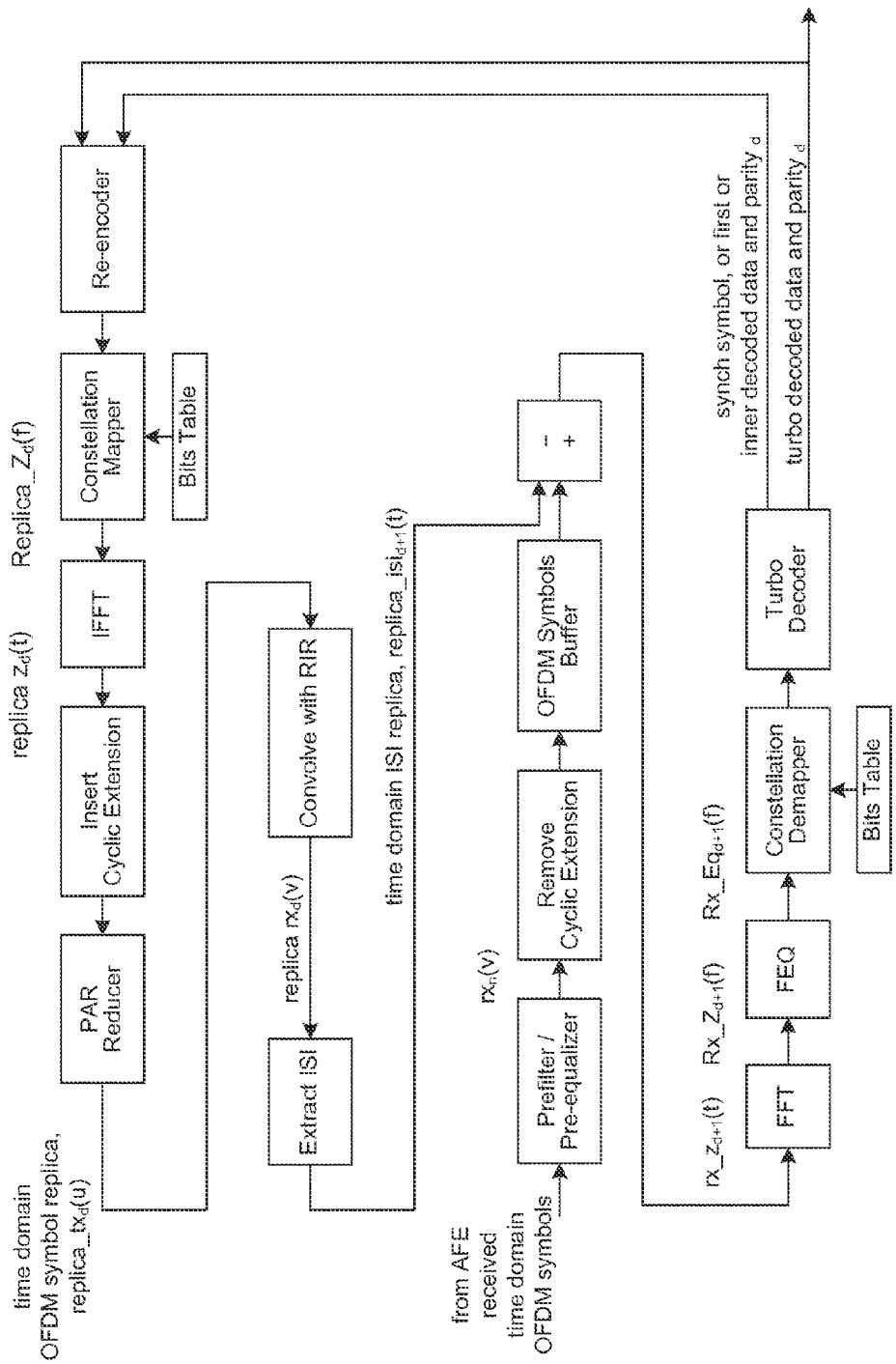
FIG. 10 is a block diagram representation of a combined turbo equalizer and turbo decoder orthogonal frequency division multiplexing (OFDM) signal.

In some embodiments, a SISO constellation demapper and mapper that supports variable size constellations may be used, FIG. 6 depicts various constellations used in digital communications (1 bit to 5 bit per symbol).

In some embodiments, transmitted symbol replica includes replication of windowing or PAR reduction.

In some embodiments. IFFT and FFT fast convolution for replica of the channel and receiver prefiltering may be used.

In some embodiments, summing of the received signal replica and echo replica (for any echo cancellation) may be performed in the frequency domain.

Examples of Embodiments

Figure 11:
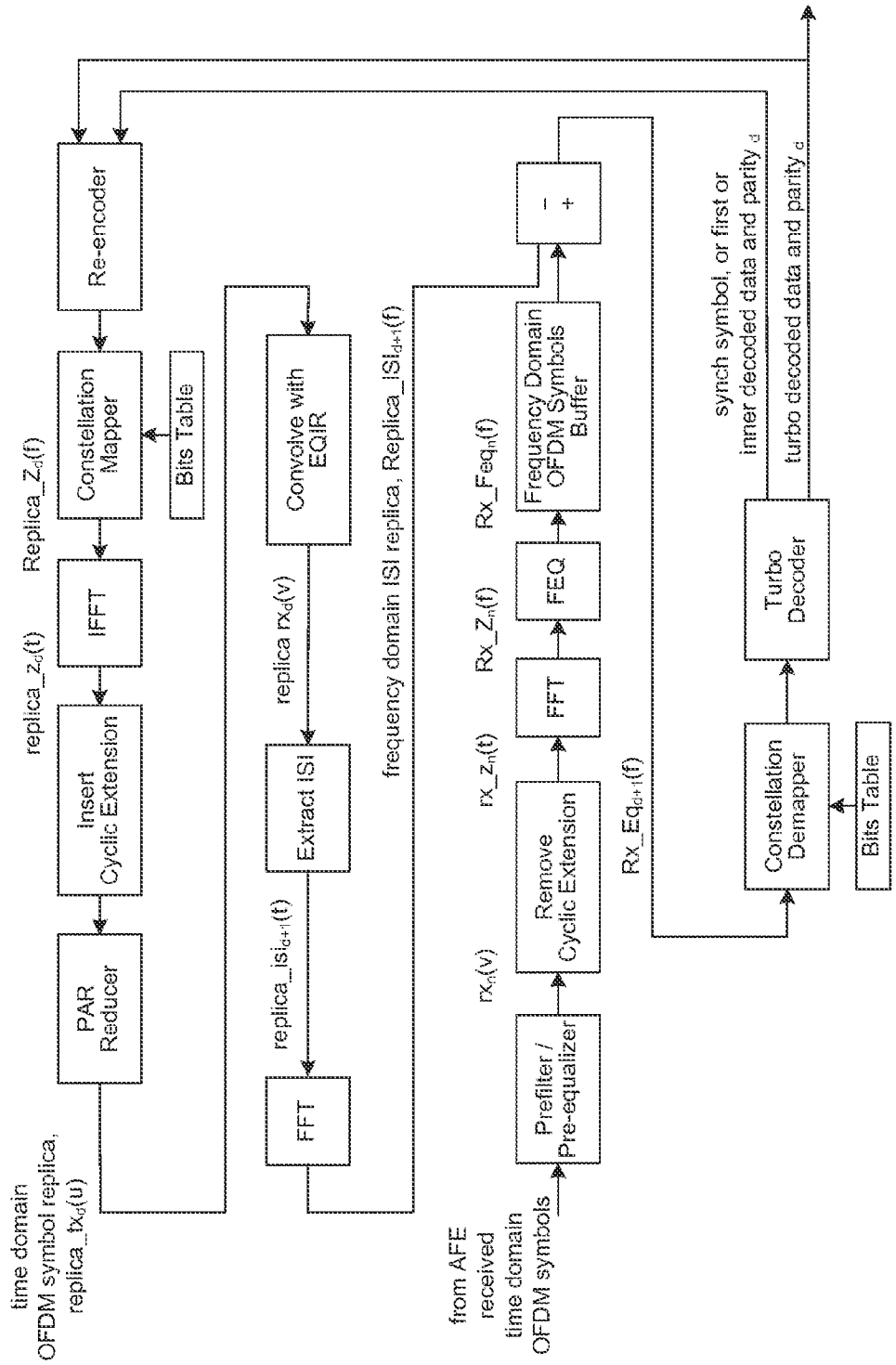
FIG. 11 is a block diagram representation of a combined turbo equalizer and turbo decoder for OFDM with frequency domain OFDM symbol buffering and inter symbol interference (ISI) cancellation.

With reference to FIG. 11, received, time domain OFDM symbols from the analog front end (AFE) are first prefiltered/pre-equalized. The prefiltering/pre-equalization has two functions: The filtering rejects out of band noise. The high pass filtering/equalization has a channel shortening effect, i.e., it reduces the effective length of the channel impulse response. Call the newest prefiltered/pre-equalized time domain OFDM symbol, $rx_n(v)$.

The time domain OFDM symbols next have their cyclic extensions removed, leaving time domain symbols that are the size of the following FFT ($rx\_z_n(t)$).

The time domain symbols are next buffered. The buffer contains symbols to be decision feedback equalized and decoded. And stores at least enough symbols to cover the interleaving of the concatenated code used. Given a block interleaver of size i bits, or a convolutional interleaver with delay i bits, and OFDM symbols that carry j bits, and not requiring that i/j=an integer, i.e. interleaving can end on an arbitrary bit in an OFDM symbo And calling the minimum buffer size b. Then for block interleavers, b=the integer part of (i/j)+(1 if the fractional part of i/j is not equal to zero)+1. I.e., b=ceiling (i/j)+1. For convolutional interleavers, b is analogous to the constraint length of a convolutional code, so it may advantageous to buffer c*b OFDM symbols, with c an integer from 2 to 10.

Received OFDM symbols to be turbo equalized and turbo decoded are stored in a time domain or frequency domain OFDM symbols buffer. Call the indices of the oldest OFDM symbol in the buffer in, and the newest n, then n=m+b−1. For convenience, assume that the ISI extends into one following symbol. And call d the index of the symbol whose data is used to decision feedback equalize the symbol with index d+1. Then d ranges from less than or equal to m−1 (symbols which have been decoded) to n−1. Data from symbol m−1 is used to decision feedback equalize symbol m, data from symbol m to DFE symbol m+1 . . . data from symbol n−1 to DFE symbol n. Assume that the last OFDM symbol removed from the buffer was either a synchronization symbol or was decoded, so that its data is available to decision feedback equalize the oldest symbol in the buffer.

Decision feedback equalization is performed on the buffered symbols. Using iteratively decoded data, a replica of the intersymbol interference from each OFDM symbol is generated, and subtracted from the following symbol. Each replica of intersymbol interference, replica_isi$_{d+1}$(t), is the portion of a replica of a complete received OFDM symbol, replica_rx$_d$ (v), that extends past the cyclic extension into the portion of the following received OFDM symbol which is demodulated by the FFT, rx_z$_{d+1}$(t).

The decision fedback equalized time domain signal, rx$_{-z}$ (t), is the input to an FFT, which outputs constellation points in the frequency domain, Rx$_{-z}$(f). The constellation points go to a Frequency Domain Equalizer (FEQ), which does one complex multiplication of each constellation point, to correct amplitude and phase.

The equalized constellation points are parallel to serial converted, and go to a SISO constellation demapper. After the parallel to serial conversion, each OFDM frequency bin may be viewed as single carrier modulation, with the exception of variable sized constellations.

The SISO constellation demapper (lowest branch of FIG. 11) accepts constellation points representing one or more bits, and the number of bits that each constellation represents. It outputs encoded bits, with reliability information for all of the bits, for turbo decoding.

For the decision feedback equalization, data from the turbo decoder is input to a re-encoder, and the re-encoded data is used to generate the replicas of the ISI.

Figure 12:
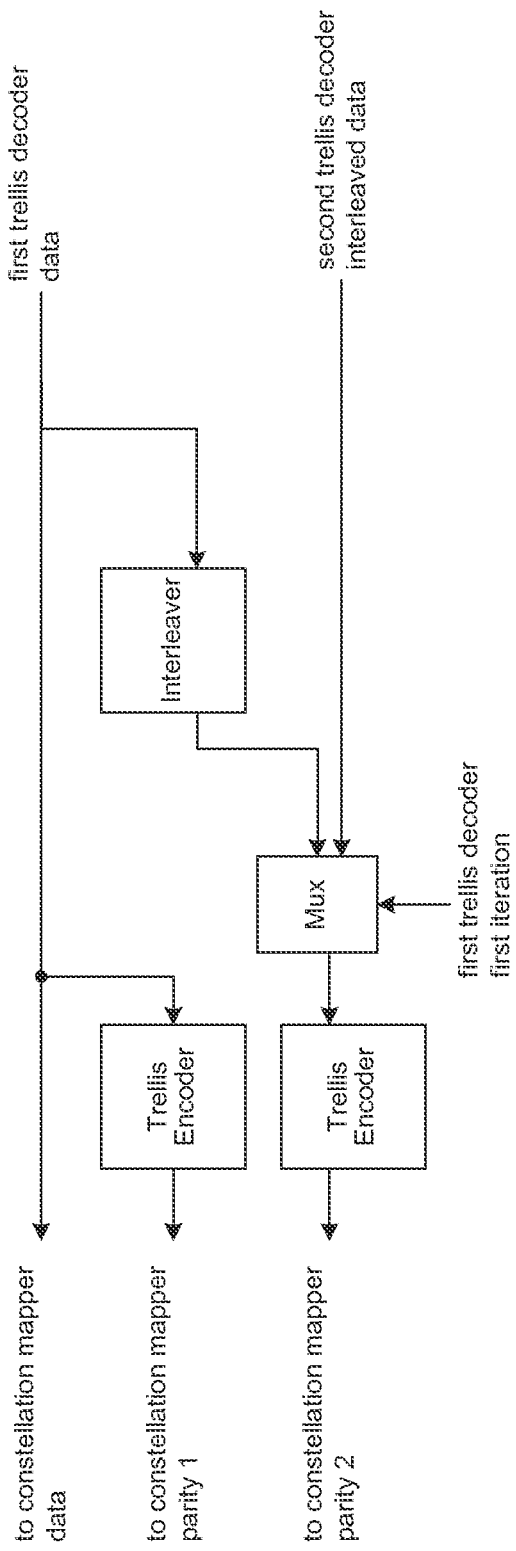
FIG. 12 illustrates a re-encoder for parallel concatenated convolutional codes.
Figure 13:
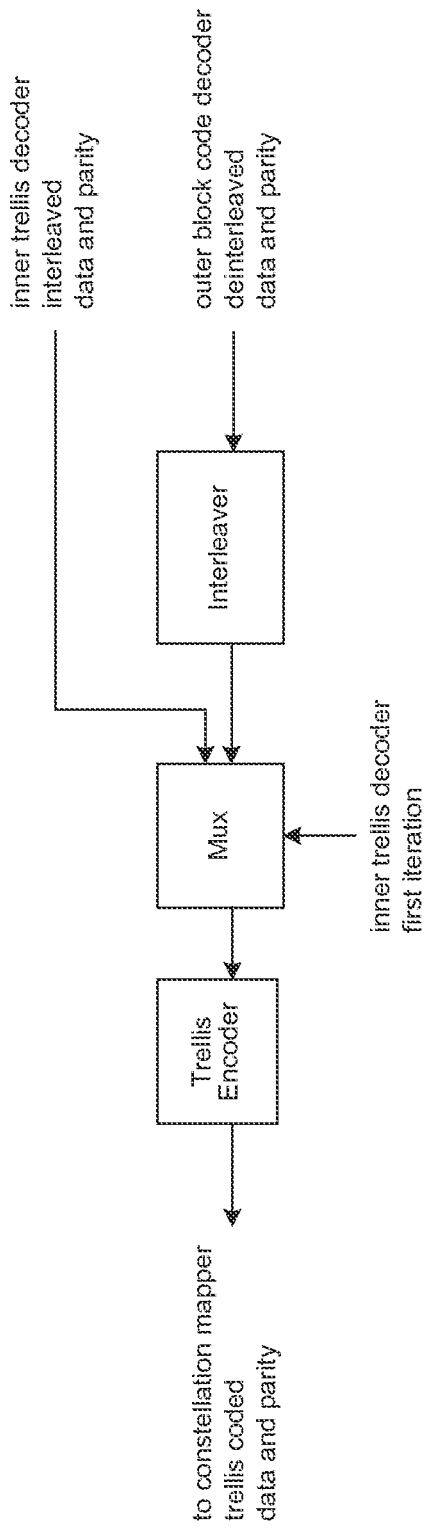
FIG. 13 illustrates a re-encoder for serially concatenated TCM and block codes.

With reference to FIG. 12 and FIG. 13, the input to the first or inner component decoder of a concatenated code does not require any interleaving or deinterleaving to be decoded. And can be decoded as a single, non-concatenated code. The input to the second or outer component decoder of a concatenated code requires interleaving or deinterleaving. And the interleaving may extend over multiple OFDM symbols. Which are first buffered, but not yet decision feedback equalized. Due to the interleaving, some of the data needed to decode the second or outer component code, and use it for decision feedback equalization, may be contained within symbols that have not yet been decision feedback equalized and decoded themselves. So one class of data is used for the first iteration of decision feedback equalization, and another class for the subsequent iterations. Both classes may be either hard or soft data If the interleaving fits within one OFDM symbol, then the data can be turbo decoded without any decoding of the following symbols. But if the interleaving extends over more than one OFDM symbol, then both classes of data are used.

Data Classes

Data available before the interleaving or deinterleaving delay. Which includes: Synchronization symbols. And data decoded by a first (for a parallel concatenated code) or inner (for a serially concatenated code) component decoder.

Data which is only available after the interleaving or deinterleaving delay. Which includes the output of the second or outer component decoder, and the output of either decoder for the second or later iterations of the turbo decoder.

Synchronization symbols can be decoded as hard data, without any decoding of the following symbols. First or inner component codes can be decoded as for a code that isn't concatenated, without any interleaving delay. And can be re-encoded for the first iteration of decision feedback equalization.

As with any concatenated code, after data is decoded by the first or inner decoder, it is then deinterleaved or interleaved, and becomes available to the second or outer decoder. After enough data is available to the second or outer decoder, the turbo decoder can execute one or more decoding iterations (for each iteration of decision feedback equalization). After the interactions of the turbo decoder, new turbo decoded data is available for re-encoding. Then class 2 data can be provided to the re-encoder. And decision feedback equalization and turbo decoding iterated.

When the second or outer component code is a systematic code, the data does not need to be re-encoded, since when a code is systematic the decoder's output is a corrected version of its input. It may be convenient to use a decoder that outputs data only, rather than data and parity, and re-encode the parity.

With reference to FIG. 12, for parallel concatenated codes, decoded data that's not interleaved is interleaved to re-encode parity 2. For serially concatenated codes, data that's been decoded by the outer component decoder is interleaved to re-encode the inner component code.

One or more iterations of the turbo decoder may be performed for each iteration of the turbo equalization. After the interactions of the turbo decoder, new turbo decoded data is available for re-encoding.

Each replica of ISI is generated by first generating a replica of the transmitted signal, and then filtering it by the received frequency response (RFR). Where the RFR equals the filtering from the transmitted constellations to the FFT demodulator. So the RFR=any transmitter gain scaling of constellations x the channel frequency response x the receiver prefiltering/pre-equalization frequency response. And the RFR and received impulse response (RIR) are a Fourier transform pair.

In some embodiments, replicas of the transmitted OFDM symbols are generated by:

Constellation mapping the hard or soft re-encoded data. The constellations may be of variable sizes, i.e. each constellation point may represent one or more data bits. A table stores the number of data bits for each frequency bin (subcarrier) from f=0 to the highest transmitted frequency bin. n data bits are mapped to one of 2^n constellation points. Where each constellation point is a point in the Euclidean plane, described by a complex number, Z=X+jY. Call the outputs of the constellation mapper, Replica_Z$_f$=X$_f$+jY$_f$. For unused frequencies Replica_Z$_f$=0. In general, transmitters may include gain scaling or transmit spectrum shaping, so that Z$_f$=g$_f$x (X$_f$+jY$_f$).

The generation of replicas may further include performing a serial to parallel conversion of the constellation points, Replica_Z$_f$, giving the frequency domain inputs to an inverse fast Fourier transform.

The generation of replicas may further include performing an IFFT, Replica_Z$_d$(f)-> replica_z$_d$(t). The IFFT generates N$_{td}$ real time domain samples, i.e. modulates the constellation points. An oversampled IFFT may be used. In which case Z (f) is zero padded.

Another operation includes inserting the cyclic extension. Call replica_z$_d$(t) with its cyclic extension, and PAR reduction replica_tx$_d$(u). The cyclic extension acts as a guard interval, which is removed by the receiver before demodulation, so that intersymbol interference that is constrained within the cyclic extension is ignored. The cyclic extension may consist of only a cyclic prefix, or both a cyclic prefix and cyclic suffix. A cyclic prefix prepends the last n$_{cp}$ samples of replica_z$_d$(t) to the beginning of replica_z$_d$(t). A cyclic suffix appends the first n$_{cs}$ samples of replica_z$_d$(t) to the end of replica_z$_d$(t). A windowing, of length β, may be used to overlap the cyclic suffix of an OFDM symbol with the cyclic prefix of the following OFDM symbol. Then the number of samples of the cyclic extension, $N_{ce}=N_{cp}+N_{cs}-β$. Call the number of samples of an OFDM symbol $N_{sym}=N_{td}+N_{ce}$. Call the number of samples of the received impulse response $N_{rir}$. If $n_{Nir}$, is less than or equal to n$_{ce}$, then the intersymbol interference has been constrained to fit within the cyclic extension, and will not be demodulated. Since the cyclic extension is a guard interval which is not demodulated, the cyclic extension reduces the data rate.

Another operation includes performing any windowing or PAR reduction, giving a time domain replica of the transmitted OFDM symbol. PAR reduction may be as simple as clipping.

Another operation includes filtering the replica of the transmitted signal by the received frequency response produces a replica of the received signal. So a time domain replica of the received signal equals a time domain replica of the transmitted signal convolved with the received impulse response. A frequency domain replica of the received signal equals a frequency domain replica of the transmitted signal multiplied by the received frequency response.

The time domain filtering may be by direct convolution, i.e., a finite impulse response filter. Then the replica of the received replica_rx(t)=replica_tx(t)*response_rx(t)

Alternatively, the filtering may be performed by a fast circular convolution as follows:

Call the replica of the transmitted OFDM symbol in the time domain, replica_tx (u). Zero pad replica_tx (u) to a length greater than or equal to one OFDM symbol plus the ISI to be replicated. Preferably the prefilter/pre-equalizer will shorten the effective channel so that this will be 2×N$_{td}$.

Perform an FFT, replica_tx(u)-> Replica_Tx(g), to transform the zero padded time domain representation to the frequency domain.

Generate an estimate of the received frequency response RFR(g) that is equal in length to Replica_Tx(g).

Multiply in the frequency domain, Replica_Rx(g)=RFR(g)*Replica_Tx(g), to give a replica of the received signal in the frequency domain.

When using echo cancellation, the replica of the echo in the frequency domain may be added to the replica of the received signal in the frequency domain. Reptica_Rx(g)=Replica_Rx(g)+Replica_Echo(g).

Perform an IFFT, Replica_Rx(g)-> replica_rx(v). Giving a replica of the received OFDM symbol, with echo if it was added, in the time domain.

Extract the portion of replica_rx(v) which extends into the following symbol. Which gives the replica of the intersymbol interference, replica_isi(t).

The buffering and ISI cancellation may be performed in the frequency domain, rather than the time domain. In which case, the received time domain OFDM symbols without cyclic extension, rx_z$_n$(t), are input to an FFT, transforming them to frequency domain symbols, Rx_Z$_n$(f). And next frequency domain equalized, by one complex multiplication for each frequency bin, giving Rx_Feq$_n$(f). And next buffered. In which case, the filtering of the replicas of the transmitted time domain OFDM symbols, reptica_tx(u), is by the product of the RFR and the FEQ. Each time domain ISI replica, replica_isi$_{d+1}$(t) is input to an FFT, giving a frequency domain LSI replica, Replica_ISI$_{d+1}$(f). Each Replica LSI$_{d+1}$(f) is subtracted from the buffered Rx_Feq$_{d+1}$(f), giving Rx_Eq$_{d+1}$(f).

Note that, time domain decision feedback equalization of an OFDM signal is equivalent to passband DFE of a single carrier signal. And frequency domain DFE of an OFDM signal is equivalent to baseband DFE of a single carrier signal.

Also the time domain OFDM signal can be split into two or more bands, where the higher frequency band(s) are prefiltered by a high pass filter/equalizer with a high enough cut off frequency that the remaining Intersymbol Interference is of short enough duration to fit within the cyclic extension, so that no further equalization is needed for that band. I.e. the prefilter high pass filter/equalize has enough of a channel shortening effect. Then the lower band(s) can be processed at a lower sampling rate than the full signal.

In some implementations, a turbo decoding method, as disclosed above, includes receiving a plurality of orthogonal frequency division multiplexing (OFDM) symbols, and generating replicas of the received plurality of OFDM symbols which includes reducing a peak to average ratio.

In some implementations, a disclosed combined turbo decoding and equalization method includes receiving a plurality of turbo coded, orthogonal frequency division modulation (OFDM) symbols, demodulating, turbo decision feedback equalizing, and turbo decoding the received plurality of OFDM symbols, generating replicas of the transmitted plurality of OFDM symbols, channel, and intersymbol interference, buffering of the received plurality of OFDM symbols, and ISI subtraction in the time domain or the frequency domain, and summing the generated replicas with echo replicas in time domain or the frequency domain to also perform echo cancellation.

Figure 14:
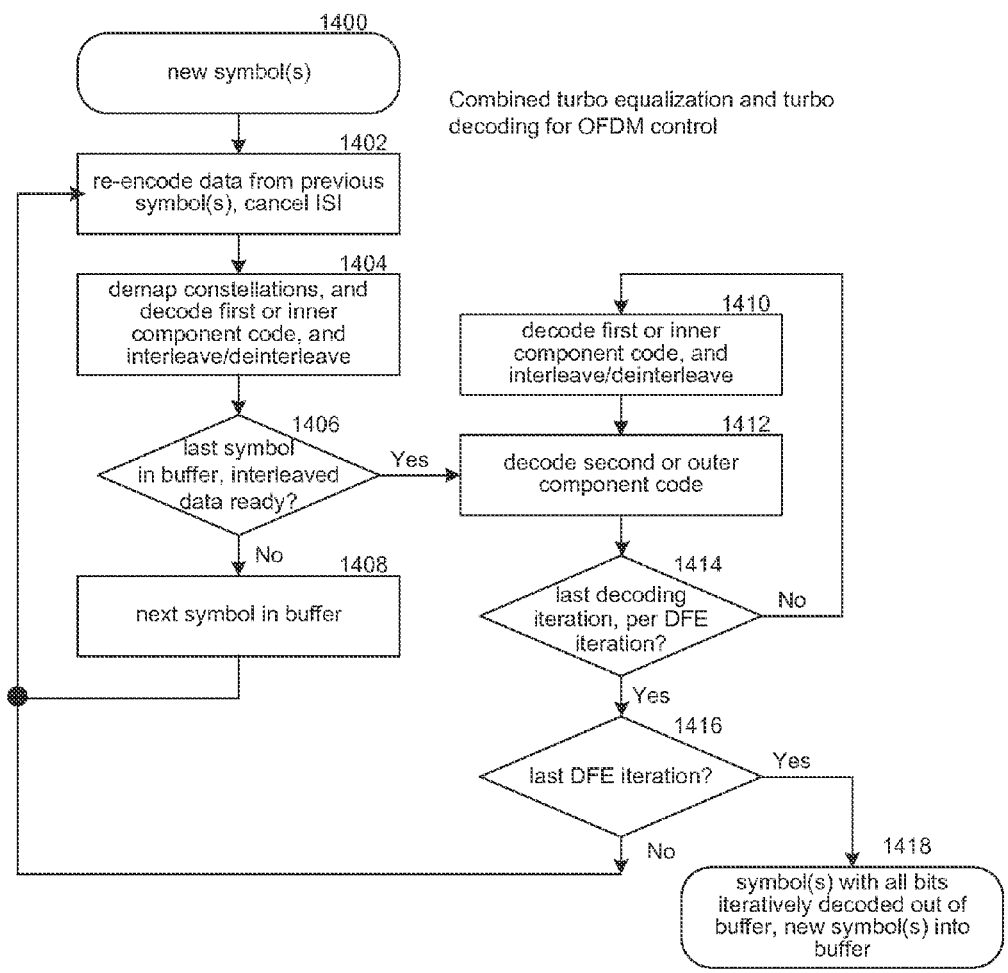
FIG. 14 is a flowchart implementation for a combined turbo equalization and turbo decoding for OFDM control.

FIG. 14 is a flowchart of an example workflow of combined turbo equalization and turbo decoding for OFDM control. At 1400, new symbols are received. At 1402, data from previous symbol(s) is reencoded and ISI is cancelled. At 1404, constellation is demapped and first or inner component code is decoded and interleave/deinterleave operation is performed.

At 1406, a decision is made regarding whether last symbol in buffer, interleaved data is ready. If not, at 1408, next symbol in the buffer is processed as in 1402. If yes, then, at 1412, a second or outer component code is decoded. At 1414, a check is made whether or not the iteration is a last decoding iteration per DFE iteration. If no, then at 1410, the first or inner component code is decoded and interleave/deinterleave operation is performed, after which 1412 is performed again. If yes, then at 1416, a check is made whether the DFE iteration was last. If no, then 1402 is performed again in a next iteration. If yes, then at 1418, symbol(s) with all bits are iteratively decoded out of the buffer and new symbol(s) are added to the buffer for further processing.

It will be appreciated that techniques are disclosed for turbo decoding OFDM symbols. It will further be appreciated that techniques for combined turbo decoding and equalization are disclosed. The disclosed techniques can be implemented in receivers that receive wired or wireless OFDM signals and produce data and control bits by decoding the received signals.

The disclosed and other embodiments and the functional operations and modules described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method of performing combined turbo equalization and turbo decoding of a plurality of orthogonal frequency division multiplexing (OFDM) symbols in a communication receiver, at least partially implemented in hardware, the method comprising:
    operating a first iterative loop to produce decision feedback equalized (DFE) symbols by:
        receiving a new symbol in a buffer;
        re-encoding, when available in the buffer, data from one or more previous symbols and cancelling inter-symbol interference;
        de-mapping constellations of an output of the inter-symbol interference cancellation operation;
        decoding a first or an inner component code; and
        performing an interleaving or de-interleaving operation; and
    operating a second iterative loop on the DFE symbols to produce decoded bits by decoding, until a last iteration is reached, the first or the inner component code; and
        decoding, until the last iteration is reached a second or an outer component code of the DFE symbols and an input from the decoding of the first or the inner component code; and
        producing, upon reaching the last iteration, decoded bits.

2. The method of claim 1, further comprising:
    buffering with reliability information a number of the plurality of OFDM symbols, wherein the number is greater than or equal to an interleaving within a concatenated code or size of an low density parity check (LDPC) code used to error code the received plurality of OFDM symbols.

3. The method of claim 2, wherein the buffering comprises time domain buffering.

4. The method of claim 2, wherein the buffering comprises frequency domain buffering.

5. The method of claim 1, further including:
    operating the decision feedback equalizer to receive hard or soft data from three different classes of data.

6. The method of claim 5, wherein the three different classes of data include a first class of data comprising &mapped data, a second class of data comprising a re-encoded synchronization symbol or re-encoded first or inner output of a turbo decoder, and a third class of data comprising re-encoded output of an outer decoder of turbo decoding.

7. The method of claim 1, further including:
turbo decoding the plurality of signal constellations, wherein a first number of least significant bits of constellations are both block coded and trellis coded, and a second number of most significant bits block coded only.

8. The method of claim 1, further comprising:
generating replicas of the received plurality of OFDM symbols for decision feedback equalization.

9. The method of claim 1, further including:
operating a peak to average ratio reducer to generate replicas of the plurality of OFDM symbols which have had their peak to average ratio reduced.

10. The method of claim 1, further including:
filtering replicas of the received plurality of OFDM symbols by a replica of a receive channel, wherein the filtering may be by a direct convolution or by a fast convolution using a fast Fourier transform (FFT) and an inverse FFT (IFFT).

11. The method of claim 1, further including:
subtracting, from the received plurality of OFDM symbols, corresponding replicas of intersymbol interference, and corresponding replicas of echo.

12. The method of claim 1, further comprising:
storing, when the new symbol is not the last symbol in the buffer, the new symbol in the buffer as a next symbol.

13. The method of claim 1, further comprising:
performing decoding of the first or inner component code when the last decoding iteration is not reached.

14. A communication receiver apparatus, comprising:
a memory storing instructions; and
a processor that reads the instructions from the memory and causes the communication receiver to perform combined turbo equalization and turbo decoding of a plurality of orthogonal frequency division multiplexing (OFDM) symbols by:
operating a first iterative loop to produce decision feedback equalized (DFE) symbols by:
receiving a new symbol in a buffer;
re-encoding, when available in the buffer, data from one or more previous symbol and cancelling inter-symbol interference;
de-mapping constellation of an output of the inter-symbol interference cancellation operation;
decoding a first or an inner component code; and
performing an interleaving or de-interleaving operation; and
operating a second iterative loop on the DFE symbols to produce decoded bits by decoding, until a last iteration is reached, the first or the inner component code; and
decoding, until the last iteration is reached a second or an outer component code of the DFE symbols and an input from the decoding of the first or the inner component code; and
producing, upon reaching the last iteration, decoded bits.

15. The communication receiver apparatus of claim 14 wherein the processor further performs:
buffering with reliability information a number of the plurality of OFDM symbols, wherein the number is greater than or equal to an interleaving within a concatenated code or size of an low density parity (LDPC) code used to error code the received plurality of OFDM symbols.

16. The communication receiver apparatus of claim 15, Wherein the buffering comprises time domain buffering.

17. The communication receiver apparatus of claim 15, wherein the buffering comprises frequency domain buffering.

18. The communication receiver apparatus of claim 14, wherein the processor further performs:
operating the decision feedback equalizer to receive hard or soft data from three different classes of data.

19. The communication receiver apparatus of claim 18, wherein the three different classes of data include a first class of data comprising demapped data, a second class of data comprising a re-encoded synchronization symbol or re-encoded first or inner output of a turbo decoder, and a third class of data comprising re-encoded output of an outer decoder of turbo decoding.

20. The communication receiver apparatus of claim 14, wherein the processor further performs:
turbo decoding the plurality of signal constellations, wherein a first number of least significant bits of constellations are both block coded and trellis coded, and a second number of most significant bits block coded only.

21. The communication receiver apparatus of claim 14, wherein the processor further performs:
generating replicas of the received plurality of OFDM symbols for decision feedback equalization.

22. The communication receiver apparatus of claim 14, wherein the processor further performs:
operating a peak to average ratio reducer to generate replicas of the plurality of OFDM symbols which have had their peak to average ratio reduced.

23. The communication receiver apparatus of claim 14, wherein the processor further performs:
filtering replicas of the received plurality of OFDM symbols by a replica of a receive channel, wherein the filtering may be by a direct convolution or by a fast convolution using a fast Fourier transform (FFT) and an inverse FFT (IFFT).

24. The communication receiver apparatus of claim 14, wherein the processor further performs:
subtracting, from the received plurality of OFDM symbols, corresponding replicas of intersymbol interference, and corresponding replicas of echo.

* * * * *